United States Patent
Onodera

(10) Patent No.: US 8,035,790 B2
(45) Date of Patent: Oct. 11, 2011

(54) MOUNT STRUCTURE, ELECTROOPTIC DEVICE, AND ELECTRONIC DEVICE

(75) Inventor: Hiroyuki Onodera, Matsumoto (JP)

(73) Assignee: Sony Corporation, Tokyo (JP)

( * ) Notice: Subject to any disclaimer, the term of this patent is extended or adjusted under 35 U.S.C. 154(b) by 1035 days.

(21) Appl. No.: 11/626,460

(22) Filed: Jan. 24, 2007

(65) Prior Publication Data

US 2007/0195763 A1    Aug. 23, 2007

(30) Foreign Application Priority Data

Feb. 23, 2006    (JP) .................................. 2006-046401

(51) Int. Cl.
*G02F 1/1345* (2006.01)
(52) U.S. Cl. ........................................................ 349/152
(58) Field of Classification Search ......................... None
See application file for complete search history.

(56) References Cited

FOREIGN PATENT DOCUMENTS

| JP | 2002215059 A | 7/2002 |
|---|---|---|
| JP | 2003-258027 | 9/2003 |

*Primary Examiner* — Lucy Chien
(74) *Attorney, Agent, or Firm* — K&L Gates LLP

(57) ABSTRACT

A mount structure includes a first electronic component and a second electronic component mounted to the first electronic component. The first and second electronic components include first and second terminals arrayed in strips and extending along a plurality of lines passing through first and second common points The second terminals are connected to the corresponding first terminals. The second common point substantially corresponds to the first common point. The range in which the first electronic component and the second electronic component are mounted includes a terminal region in which the first and second terminals are arrayed substantially at a specified interval, and a no terminal region in which there is no first terminals across a range wider than the specified interval or there are first dummy terminals in place of the first terminals. In the no terminal region, second dummy terminals are arrayed in strips and extend along the lines passing through the second common point.

15 Claims, 6 Drawing Sheets

MOUNT STRUCTURE, ELECTROOPTIC DEVICE, AND ELECTRONIC DEVICE

The entire disclosure of Japanese Patent Application No. 2006-046401, filed Feb. 23, 2006 is expressly incorporated by reference herein

BACKGROUND

1. Technical Field

The present invention relates to a mount structure, an electrooptic device, and an electronic device, and in particular, it relates to a mount structure in which terminal groups including multiple terminals are conductively connected to each other.

2. Related Art

Known electrooptic devices mounted to electronic devices such as portable phones, notebook computers, and TV sets have a structure including an electrooptic panel such as a liquid-crystal display panel and a flexible wiring board mounted to the electrooptic panel. When a driving circuit for driving the electrooptic panel is mounted to the panel, the flexible wiring board supplies display data and control signals sent from the display control system of the electronic device to the electrooptic panel. When the driving circuit is not mounted to the electrooptic panel, the driving circuit is mounted to the flexible wiring board or another circuit board to which a flexible wiring board is connected. In such cases, the flexible wiring board supplies a driving signal output from the driving circuit to the electrooptic panel.

The above structure is such that multiple input terminals are arrayed in a row along a rim of the electrooptic panel, while multiple connecting terminals are arrayed in a row along a rim of the flexible wiring board in correspondence with the input terminals. When the flexible wiring board is mounted to the electrooptic panel, the input terminal row and the connecting terminal row are opposed with an anisotropic conductive film (ACF) or the like in between, to which heat or pressure is applied with a tool to bring the corresponding input terminals and connecting terminals into conductive connection.

The connecting terminal row of the flexible wiring board is in exact correspondence with the input terminal row of the electrooptic panel. However, since the flexible wiring board is mainly formed of polyimide resin, it expands or contracts greatly because of temperature changes or moisture absorption, thus changing the terminal pitch of the connecting terminal row. This causes deviations in array pitch between the connecting terminal row and the input terminal row on the glass substrate that is little influenced by temperature changes or moisture absorption to bring the connecting terminals and the input terminals out of agreement with each other, thus causing mount failure.

Thus, there is proposed a terminal structure and a method for mounting in which the multiple input terminals and the multiple connecting terminals are arranged linearly along multiple lines that pass through common points arranged apart in a predetermined direction and intersecting the direction of the array of the input terminal row and the connecting terminal row so that even if the array pitch of the connecting terminal row changes to some extent because of the expansion or contraction of the flexible wiring board, the array pitches can be agreed to each other by relatively shifting the input terminal row and the connecting terminal row in the direction in which the distances from the common points change (e.g., refer to JP-A-2003-258027).

However, even the above structure in which the array pitch can be agreed by adjustment at packaging has the problem of disagreement between terminals, causing mount failure due to uneven expansion or contraction of the flexible wiring board.

Furthermore, it also has the problem of disagreement between terminals, causing mount failure due to variations in the pattern of the connecting terminals of the flexible wiring board (e.g., variations in the width of the connecting terminals).

SUMMARY

An advantage of some aspects of the invention is to provide a mount structure and an electrooptic device with reduced mount failure by reducing the deviation of the pattern of the terminals in the terminal groups of a connecting board and an electronic component.

A mount structure according to a first aspect of the invention comprises: first electronic component; and a second electronic component mounted to the first electronic component. The first electronic component includes a first terminal group having a plurality of first terminals, the first terminals being arrayed in strips and extending along a plurality of lines passing through a first common point apart in a predetermined direction intersecting the array of the terminals. The second electronic component includes a second terminal group having a plurality of second terminals connected to the corresponding first terminals of the first terminal group, the second terminals being arrayed in strips and extending along a plurality of lines passing through a second common point that substantially corresponds to the first common point. The range in which the first electronic component and the second electronic component are mounted includes a terminal region in which the first terminals are arrayed substantially at a specified interval and a no terminal region in which there is no first terminals across a range wider than the specified interval or there are first dummy terminals in place of the first terminals. The second terminal group has in the terminal region the second terminals arrayed in correspondence with the first terminals and has in the no terminal region second dummy terminals arrayed in strips and extending along the lines passing through the second common point.

With this arrangement, since the second terminal group of the second electronic component has the second dummy terminals in the no terminal region, the size change of the no terminal region due to temperature changes or humidity absorption can be brought close to that of the terminal region to increase the evenness of size change. Moreover, the presence of the second dummy terminals adjacent to the second terminals at the rims of the terminal regions allows the pattern of the second terminals to be brought close to that of the other second terminals, thereby decreasing variations in pattern. Thus, mount failure due to the disagreement between the first terminals and the second terminals can be reduced. This arrangement is particularly useful when the size change of the first electronic component due to temperature changes or humidity absorption is larger than that of the second electronic component.

An electrooptic device according to a second aspect of the invention comprises: an electrooptic panel; and a connecting board mounted to the electrooptic panel. The electrooptic panel has a first terminal group including a plurality of first terminals; the connecting board has a second terminal group including a plurality of second terminals conductively connected to the corresponding first terminals of the first terminal group; the range in which the electrooptic panel and the connecting board are mounted includes a terminal region in which the first terminals are arrayed substantially at a specified interval and a no terminal region in which there is no first terminals across a range wider than the specified interval or there are first dummy terminals in place of the first terminals; and the second terminal group has in the terminal region the second terminals arrayed in correspondence with the first terminals and has second dummy terminals in the no terminal region.

The first terminal group on the substrate of the electrooptic panel has first terminals such as selecting (gate)-potential input terminals for selecting active elements (e.g., TFT elements) provided for every pixel and connected to pixel electrodes, data (source)-potential input terminals for supplying specified potential to the active elements, and common-potential input terminals for supplying potential to common electrodes opposed to the pixel electrodes. The multiple kinds of terminal group are sometimes arrayed apart from one another from one kind to another to increase discrimination during examination or mounting. Accordingly, the first terminals are generally arrayed at an equal pitch in the terminal region; however, a no terminal region wider than the pitch is formed at the boundary where the kind of the first terminals changes. That is, a no terminal region is formed between the terminal regions. The no terminal region sometimes has no terminals at all or sometimes has the first dummy terminals.

In this case, the second terminal group on the connecting board such as a flexible wiring board has the second terminals at an equal pitch in the terminal region, but has no second terminals in the no terminal region. Thus, the influence on expansion or contraction due to temperature changes or humidity absorption in the no terminal region of the connecting board is different from that in the terminal region, providing uneven size change. Therefore, the agreement between the terminals cannot be achieved even by positioning during mounting, so that mount failure cannot be prevented. Furthermore, the pattern of the second terminals at the rims of the terminal regions becomes different from that of the other second terminals in the terminal region (terminals between the other second terminals) because no other terminals are present in the adjacent no terminal region. This causes variations in pattern (e.g., the width of the terminals), resulting in mount failure.

In contrast, according to an embodiment of the invention, the second terminal group of the connecting board has second dummy terminals in a no terminal region. Accordingly, the size change of the no terminal region due to temperature changes or humidity absorption can be brought close to that of the terminal region to increase the evenness of size change. Moreover, the presence of the second dummy terminals adjacent to the second terminals at the rims of the terminal regions allows the pattern of the second terminals to be brought close to that of the other second terminals, so decreasing variations in pattern. Thus, mount failure due to the disagreement between the first terminals and the second terminals can be reduced.

Preferably, the first terminal group has a plurality of first terminals provided at one kind of wires and arrayed in the one terminal region and the first terminals provided at other kinds of wires and arrayed in the one terminal region via the no terminal region. In this case, the first terminals of one kind of wires and the first terminals of the other kind of wires are disposed with the no terminal region in between, so that the discrimination of the terminals during examination can be increased. Here the one kind of wires and other kinds of wires indicate, for example, selecting (gate) wires and data (source) wires connected to the active elements of pixels, selecting wires and common wires connected to common electrodes, or data wires and common wires.

Preferably, the connecting board has wires having the second terminals and dummy wires having the second dummy wires, the wires and the dummy wires being arrayed with an equal pitch. With this arrangement, dummy wires are provided not only in the mount region of the connecting board but in the wire region adjacent to the mount region, so that the evenness of the size change of the connecting board and the pattern of the terminals can be improved.

Preferably, both the second dummy terminals in the no terminal region and the second terminals in the terminal region are arrayed substantially at the predetermined interval to form an integrated terminal row. With this arrangement, the second dummy terminals in the no terminal region and the second terminals in the terminal region are arrayed substantially at the predetermined intervals to form an integrated terminal row. Thus, the second terminals at the rim of the terminal regions are under the same situation as that of the other second terminals. This further prevents mount failure arising from the disagreement of the first terminals and the second terminals.

Preferably, the second dummy terminals are arrayed substantially at the predetermined interval in the no terminal region. With this arrangement, the second dummy terminals in the no terminal region and the second terminals in the terminal region are arrayed substantially at the predetermined interval. This further reduces size change of the no terminal region due to temperature changes and humidity absorption, thus further preventing mount failure arising from the disagreement of the first terminals and the second terminals.

Preferably, the second dummy terminals in the no terminal region are arrayed in the position corresponding to the array phase of the second terminals arrayed in the terminal region. With this arrangement, the array phase of the second dummy terminals in the no terminal region is agreed to the array phase of the second terminals arrayed in the terminal region. This further prevents mount failure.

Preferably, the first terminals and the second terminals are each arrayed in strips and extend along a plurality of lines passing through a common point apart in a predetermined direction intersecting the array of the terminals. With this arrangement, even if the array pitches of the first terminal group and the second terminal group which are set in correspondence with each other at design becomes different from each other because of temperature changes or humidity absorption, the first terminals and the second terminals can be agreed with each other by shifting the first terminal group and the second terminal group in the direction in which the distances from the common points are changed during mounting to compensate the deviation in array pitch. This prevents mount failure arising from the disagreement of the terminals.

Preferably, the second dummy terminals are arrayed in strips and extend along lines that substantially pass through the common point. Since the dummy terminals are arrayed along the lines that substantially pass through a common point as are the second terminals, the extension of the connecting board can be controlled with high accuracy.

Preferably, the connecting board is a flexible wiring board. This arrangement offers significant advantages to a flexible wiring board which changes in size greatly because of temperature changes or humidity absorption.

According to a third aspect of the invention, there is provided an electronic device comprising any of the above electrooptic devices. Examples of the electronic device include mobile phones, notebook personal computers, TV receivers, electronic clocks, and liquid crystal projectors.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
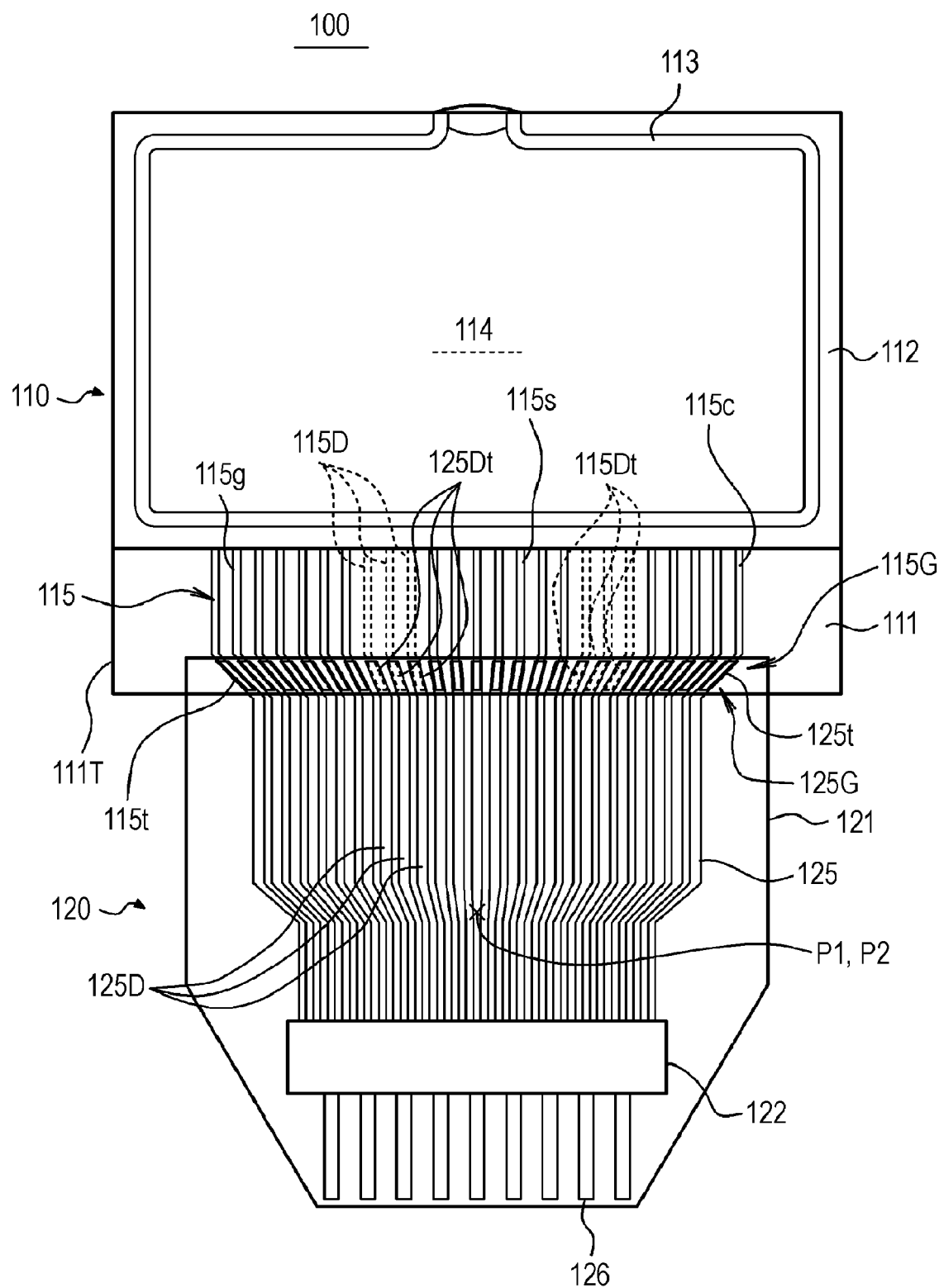
FIG. 1 is a schematic plan view of the entire structure of a first embodiment.

A first embodiment of the invention will be described with reference to the drawings. FIG. 1 is a schematic plan view of the entire structure of an electrooptic device 100 of the first embodiment. The electrooptic device 100 includes an electrooptic panel 110 and a connecting board 120 mounted to the electrooptic panel 120. Although FIG. 1 shows the wires and terminals viewed through the substrate of the connecting board 120 for the convenience of illustration, the substrate may be opaque.

The electrooptic panel 110 can achieve desired display by application of an electric field to an electrooptic material. The example illustrated is a liquid-crystal display panel. The electrooptic panel 110 is constructed such that glass or plastic substrates 111 and 112 are bonded together with a sealing member 113 in between, between which liquid crystal 114 is sealed. There are a plurality of electrodes made of a transparent conductor such as indium tin oxide (ITO) arranged on the opposing inner surfaces of the substrates 111 and 112. The opposing electrodes overlap in plan view to form a pixel. The pixels are arrayed laterally and vertically in matrix form.

The electrodes on the substrate 111 are pixel electrodes connected to active elements (e.g., thin-film transistors (TFTs)) connected to selecting wires 115g and data wires 115s, to be described later. The electrodes on the substrate 112 are common electrodes connected to a common wire 115c, to be described later. For the active elements, not only the three-terminal nonlinear elements such as TFTs but also two-terminal nonlinear elements such as thin-film diodes (TFDs) may be used. In such a case, the common electrodes are configured as a plurality of opposing strip electrodes.

The substrate 111 has a substrate extending portion 111T extending outward from the substrate 112. Onto the surface of the substrate extending portion 111T, wires 115 connected directly or indirectly to the electrodes are drawn. The wires 115 include the selecting wires 115g for supplying selecting signals (gate signals) to the active elements (TFTs) of the pixels, the data wires 115s for supplying data signals (source signals) to the active elements (TFTs) of the pixels, and one or a plurality of common wires 115c for supplying common potential to the common electrodes. The selecting wires 115g and the data wires 115s have first terminals 115t at their ends at regular intervals. If there are multiple common wires 115c, the common wires 115c also have first terminals 115t at their ends at regular intervals. The first terminals 115t configure a first terminal group 115G.

Between the terminal region in which the selecting wires 115g are arrayed and the terminal region in which the data wires 115s are arrayed is disposed a no terminal region with an interval exceeding the foregoing interval. There is no first terminal 115t in the no terminal region. That is, there is a no terminal region between different kinds of wires in the mount region having the first terminal group. Although the no terminal region may have no structure, the example illustrated has first dummy terminals 115Dt that do not contribute to the supply of potential in place of the first terminals 115t. The first dummy terminals 115Dt are disposed at ends of dummy wires 115D. In place of the dummy wires 115D, only the first terminals 115t may be disposed.

Figure 2:
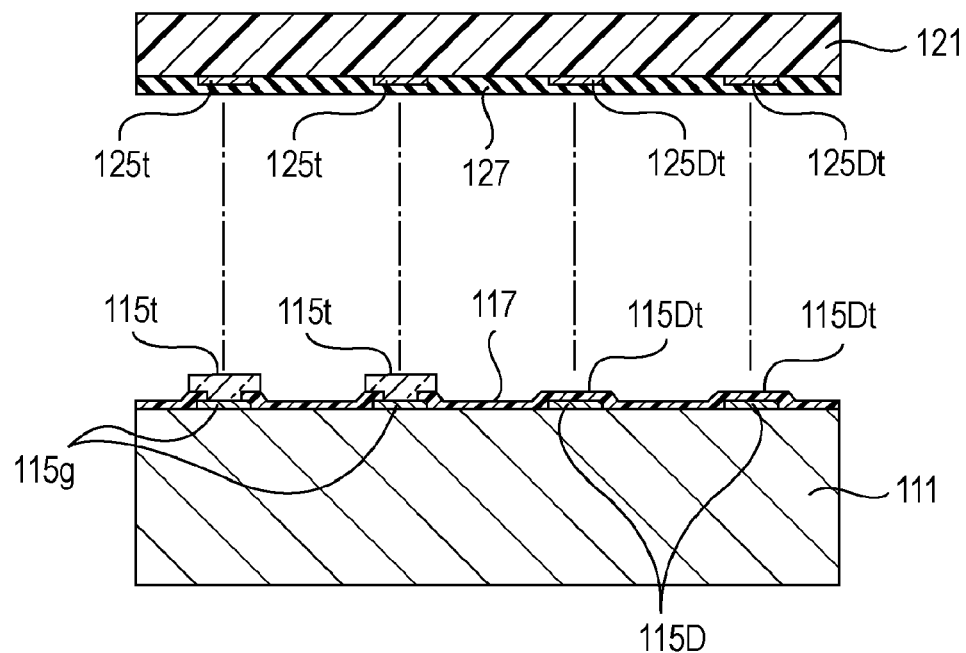
FIG. 2 is an enlarged fragmentary sectional view showing the positional relationship of the mount region of the first embodiment.

FIG. 2 is an enlarged sectional view of the crosswise part of the mount region of the electrooptic panel 110 and the connecting board 120. The wires 115 (115g, 115s, and 115c) made of metal such as aluminum and the dummy wires 115D are formed on the substrate 111, on which a passivation film 117 made of silicon oxide, silicon nitride, acrylic resin or the like is formed. At the ends of the wires 115 are provided the first terminals 115t made of a transparent conductor such as indium tin oxide (ITO) which are conductively connected to the wires 115 through the passivation film 117.

The first dummy terminals 115Dt at the ends of the dummy wires 115D are coated with the passivation film 117. Thus, the first dummy terminals 115Dt basically substantially have not a terminal structure. However, the first dummy terminals 115Dt may have the same structure as the first terminals 115t which are conductively connected to the wires 115 through the passivation film 117.

The presence of the dummy wires 115D allows the propagation of heat during mounting to be made uniform along the width of the mount region, thus providing a stable and reliable mount state. With the first dummy terminals 115Dt in the same structure as that of the first terminals 115t, the first terminals 115t and the first dummy terminals 115Dt have the same height, allowing the pressurization during mounting to be made uniform to provide a more stable mount state.

On the other hand, the connecting board 120 has a plurality striped wires 125 made of aluminum or copper on the substrate 121 made of synthetic resin or the like. First ends of the wires 125 are plated with gold in a wiring pattern such that they are exposed on the back of the connecting board 120 to form second terminals 125t. The second terminals 125t are basically arrayed at the same regular intervals as that of the first terminals 115t. Since the second terminals 125t are formed in correspondence with the first terminals 115t, they are arrayed in the terminal region basically with the same pitch as the first terminals 115t and are not provided in the no terminal region. Numeral 127 in FIG. 2 indicates a coating layer (insulating resist) that coats the part of the wires 125 other than the second terminals 125t.

Preferably, the connecting board 120 is a flexible wiring board whose substrate 121 is made of polyimide resin or the like. The use of the flexible wiring board facilitates connecting of the connecting board 120 to an appropriate portion irrespective of the arrangement or position of the electrooptic panel 110. For example, the connecting board 120 may have various electronic components such as an integrated circuit chip (a semiconductor chip) 122 having a driving circuit. The integrated circuit chip 122 is conductively connected to a plurality of input terminals 126.

The connecting board 120 has dummy wires 125D and second dummy terminals 125Dt at their ends in addition to the wires 125 and the second terminals 125t at their ends. The second dummy terminals 125Dt substantially have the completely same structure as that of the second terminals 125t (the same width and thickness with the same material).

Figure 3:
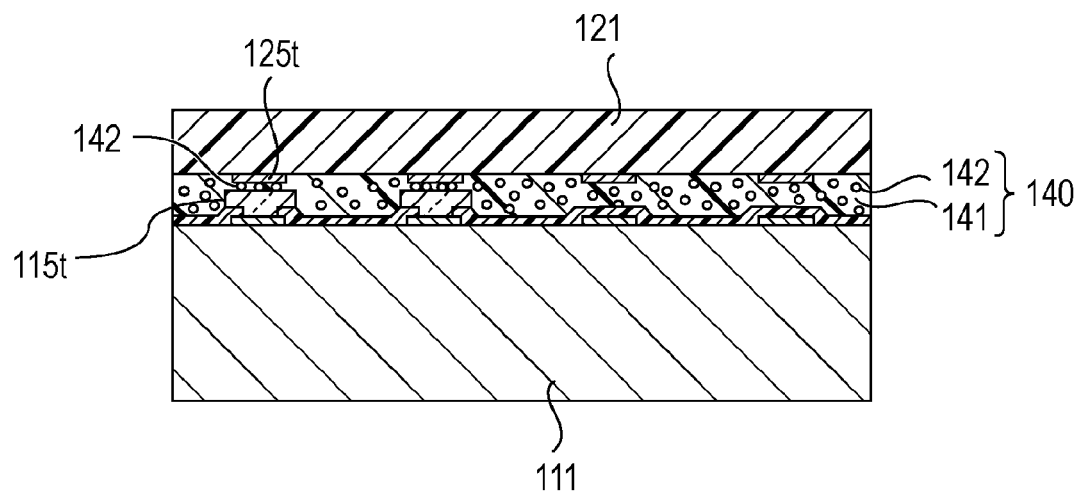
FIG. 3 is an enlarged sectional view of part of the mount region of the first embodiment.

FIG. 3 is an enlarged sectional view of the crosswise part of the mount region of the electrooptic panel 110 and the connecting board 120 in an actually mounted state. The connecting board 120 is mounted to the electrooptic panel 110 in such a manner that they are opposed with, for example, an anisotropic conductive film (ACF) 140 in between, which is brought into pressure contact with each other by a pressure-heating tool or the like (not shown). Thus, a resin base material 141 such as thermosetting resin in the anisotropic conductive film 140 softens, so that fine conductive particles 142 dispersed in the resin base material 141 are sandwiched between the first terminals 115t and the second terminals 125t to make the terminals 115t and 125t into conductive connection. This state is maintained as the resin base material 141 hardens.

Figure 4:
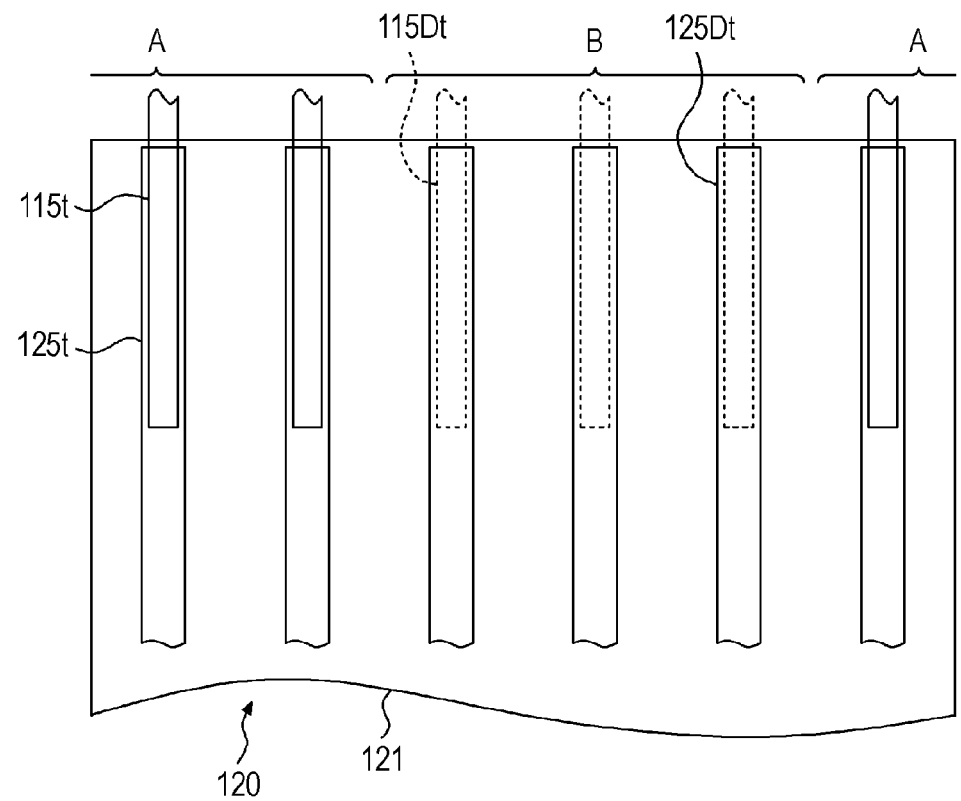
FIG. 4 is a schematic enlarged plan view of the mount region of the first embodiment.
Figure 5:
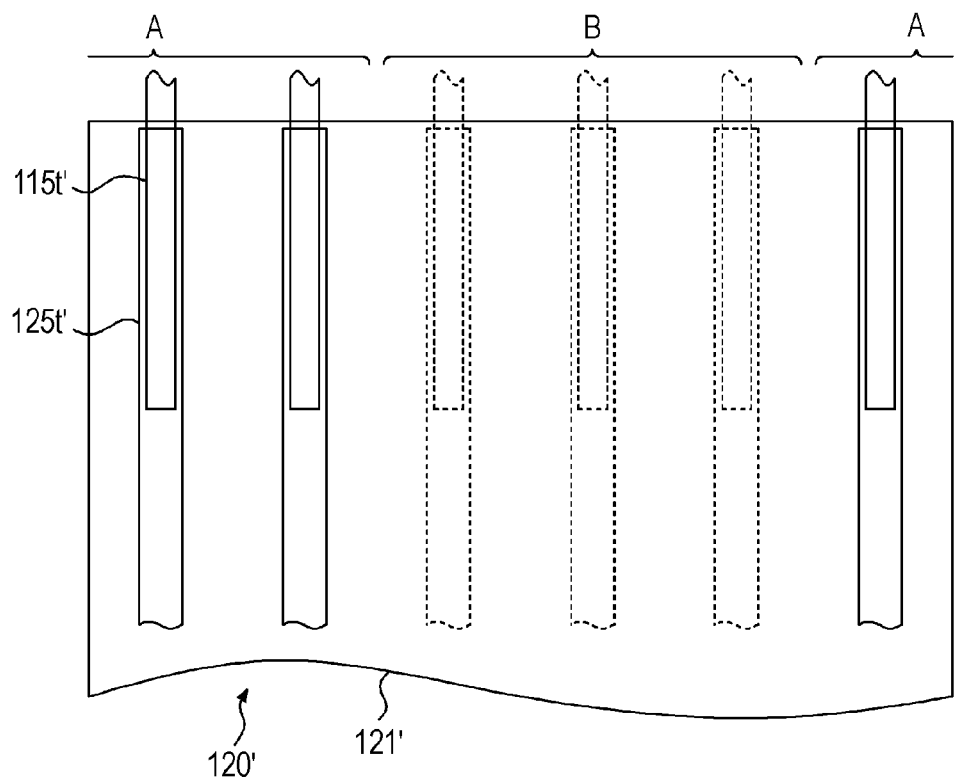
FIG. 5 is a schematic enlarged plan view of a mount region of a related art.

FIG. 4 is a schematic explanatory diagram showing in plan view a mount region of the embodiment; and FIG. 5 is a schematic explanatory diagram showing in plan view a mount region of a related art. The explanatory diagrams show the terminals arrayed in parallel in the same direction and not extending in a slanting position, as will be described later with reference to FIG. 7. This is because the invention does not depend on the pattern shape, position, and parallelism of the terminals.

The mount region of the related art will first be described. Referring to FIG. 5, terminal regions A of a connecting board 120' have second terminals 125t' but a no terminal region B has no second terminals 125t' at all. FIG. 5 shows the shapes of terminals that are not present by dotted lines for comparison with a case in which the no terminal region B also has terminals at regular pitch. With such a structure, the size change of the substrate 121' due to temperature changes or humidity absorption is different between the terminal region A and the no terminal region B, causing crosswise displacement of the second terminals 125t' of the terminal regions A on both sides of the no terminal region B in the cross direction. This may cause disagreement with the first terminals 115t', resulting in mount failure. The no terminal region B having no terminals generally changes in size more than the terminal region A having terminals.

In the process of manufacturing the connecting board 120', an aluminum or copper thin film is coated on the substrate 121', which is subjected to patterning to form a wiring pattern. In this manufacturing process, for example, mask formation by photolithography and pattern removal by wet etching are performed. However, with the conventional structure, the second terminals 125t' at the rim of the terminal region A and adjacent to the no terminal region B could have a width different from that of another second terminal 125t' in the terminal region A (which is sandwiched between other second terminals 125t') This is because the action of the etching changes because of the changes in the width of the mask due to exposing conditions or developing conductions or the unevenness of etchant due to variations in etching requirement.

In contrast, as shown in FIG. 4, the embodiment has the second dummy terminals 125Dt even in the no terminal region B. This decreases the difference in size change between the terminal region A and the no terminal region B due to temperature change or humidity absorption, and also the difference in the widths of the second terminals 125t at the rim and the other second terminals 125t at the manufacture of the connecting board 120. Thus, mount failure due to resultant displacement is reduced.

Particularly, this embodiment has a structure in which the second dummy terminals 125Dt and the second terminals 125t basically have an integrated terminal row with a regular pitch. Therefore, there is little difference between the terminal region A and the no terminal region B. This eliminates most of the influence of the no terminal region B.

Specifically speaking, the second dummy terminals 125Dt in the no terminal region B are arrayed at the same predetermined intervals as that of the terminal region A. Accordingly, the difference in size change between the terminal region A and the no terminal region B can be reduced (eliminated), and most of variations in pattern can be eliminated. Moreover, since the second dummy terminals 125Dt in the no terminal region B are disposed in agreement with the phase of the array of the second terminals 125t in the terminal region A, there is little change at the boundary between the terminal region A and the no terminal region B to provide a continuous integrated terminal row. Thus, an even size change and terminal shape can be provided across the entire width of the mount region.

Figure 6:
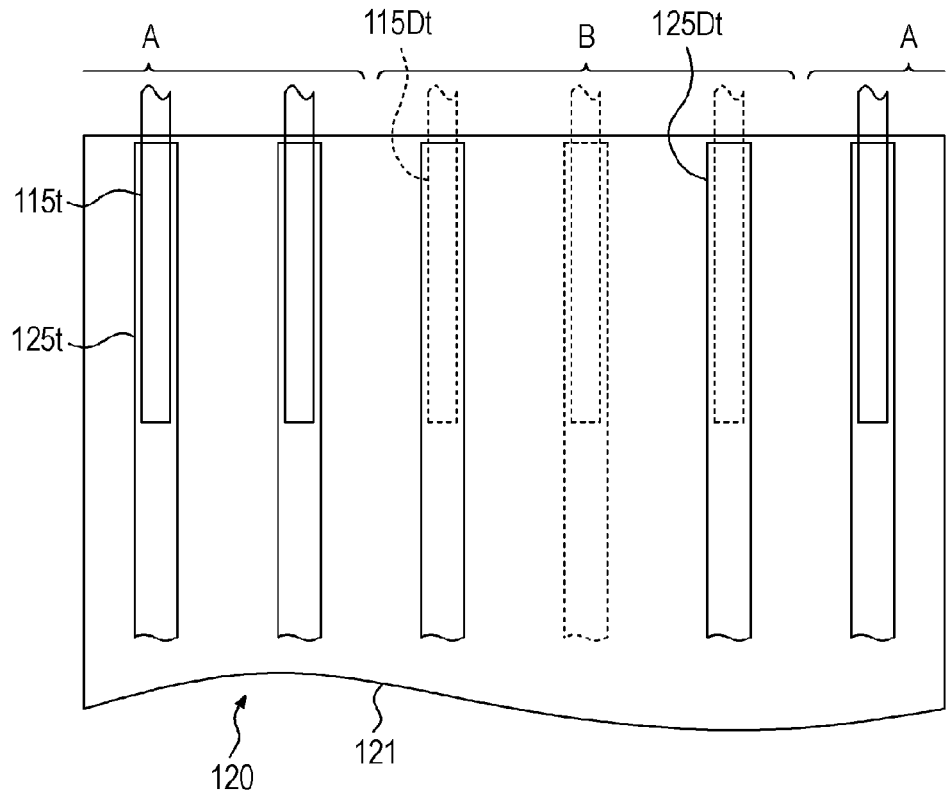
FIG. 6 is a schematic enlarged plan view of a mount region of another example.

As shown in FIG. 4, the embodiment has a structure in which the second dummy terminals 125Dt are arrayed at the same intervals and phase as those of the second terminals 125t, so that the second terminals 125t and the second dummy terminals 125Dt are arrayed at an equal pitch to form an integrated terminal row. However, the invention is not necessarily limited to that. For example, as shown in FIG. 6, the no terminal region B may have only second dummy terminals 125Dt adjacent to the terminal regions A. This structure can also reduce the difference in size change between the terminal region A and the no terminal region B to some extent because the second dummy terminals 125Dt are disposed in the no terminal region B, and reduce the variations in pattern shape of the second terminals 125t because the second terminals 125t at the rims of the terminal regions A are adjacent to the second dummy terminals 125Dt in the no terminal region B. Particularly, it is preferable that the second dummy terminals 125Dt adjacent to the terminal region A be disposed with an interval corresponding to the predetermined intervals with respect to the second terminals 125t at the rims of the terminal region A.

Figure 7:
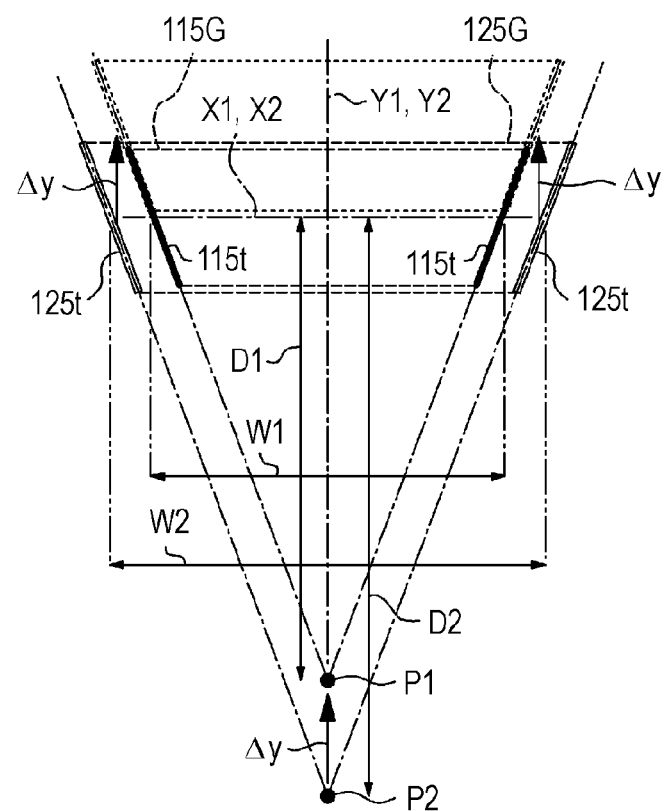
FIG. 7 is an explanatory diagram of the planar structure of the terminal groups in the mount region of the first embodiment.

FIG. 7 is an explanatory diagram of the positional relationship between the first terminal group and the second terminal group of the embodiment. FIG. 7 shows only a pair of first terminals and a pair of second terminals arranged on the outermost rims of the arrays, and omits the other terminals (one or a plurality of terminals in the middle).

In this embodiment, as shown in FIG. 1, the first terminals 115t (the first terminals 115t and the first dummy terminals 115Dt for the first dummy terminals 115Dt) are arrayed in strips and extend along a plurality of lines passing through a common point P1, and the second terminals 125t and the second dummy terminals 125Dt are arrayed in strips and extend along a plurality of lines passing through a common point P2. In the following description, the first dummy terminals 115Dt are included in the second terminals 125t, and the second dummy terminals 125Dt are included in the second terminals 125t, respectively, for convenience's sake.

Referring to FIG. 7, the first terminal group 115G including the first terminals 115t is expressed by an array axis X1 (an axis extending along the array) that is formed by connecting the middle points of the intersection of the array of the first terminals 115t and a central axis Y1 intersecting the array and passing through the middle point of the array axis X1. The second terminal group 125G including the second terminals 125t is expressed by an array axis X2 (an axis extending along the array) that is formed by connecting the middle points of the intersection of the array of the second terminals 125t and a central axis Y2 intersecting the array and passing through the middle point of the array axis X2.

The common point P1 is on the central axis Y1 and in the position apart from the first terminal group 115G. The common point P2 is on the central axis Y1 and apart from the second terminal group 125G. All the first terminals 115t of the first terminal group 115G are arrayed in strips and extend along a plurality of lines passing through the common point P1. All the second terminals 125t of the second terminal group 125G are arrayed in strips and extend along a plurality of lines passing through the common point P2.

The relationship among the common point P1, the lines passing therethrough, and the angle and distance between the first terminals 115t and the relationship among the common point P2, the lines passing therethrough, and the angle and distance between the second terminals 125t are set so as to completely correspond to each other (be the same) under some conditions during the design phase in consideration of size changes due to temperature changes and humidity absorption.

With such a structure, when the array pitch of the first terminals 115t and that of the second terminals 125t are completely the same, the corresponding first terminals 115t and second terminals 125t are completely agreed with each other in plan view by superposing the central axes Y1 and Y2 and the array axes X1 and X2, allowing reliable mounting. Such positioning is easy by the use of a known alignment mark.

On the other hand, when the connecting board 120 expands by temperature changes or humidity absorption, so that the array pitch of the second terminals 125t becomes a little larger than that of the first terminals 115t, the second terminals 125t can be agreed to the first terminals 115t by shifting the connecting board 120 upward along the central axes Y1 and Y2, as indicated by the dotted lines in FIG. 7. In this case, the array axis X2 of the second terminal group 125G deviates upward from the array axis X1 of the first terminal group 115G.

For the electrooptic panel 110, let W1 be the width of the first terminal group 115G and D1 be the distance between the array axis X1 of the first terminal group 115G and the common point P1 along the central axis Y1, and their ratio be W1/D1. For the connecting board 120, let W2 be the width of the second terminal group 125G and D2 be the distance between the array axis X2 of the second terminal group 125G and the common point P2 along the central axis Y2, and their ratio be W2/D2. Assume that the electrooptic device 100 is designed so that W1=W2 and D1=D2 (that is, W1/D1=W2/D2) under some conditions. When the ratio of W1 to W2 becomes W1<W2 by size change, the ratio of D1 to D2 generally becomes D1<D2. When the expansion or contraction of the connecting board 120 is isotropic, the relationship W1/D1=W2/D2 is held even if it changes in size.

Under the above situation, when the array axis X1 of the first terminal group 115G and the array axis X2 of the second terminal group 125G agree with each other, and the central axes Y1 and Y2 also agree with each other, as shown in FIG. 7, the corresponding first terminals 115t and second terminals 125t deviate laterally from each other. The deviation increases with lateral distance from the central axes Y1 and Y2, causing mount failure. At that time, the virtual common points P1 and P2 deviate by Δy because D1<D2.

Accordingly, when the common point P2 is shifted toward the common point P1 (when the Δy is decreased), the array axis X2 deviates upward from the array axis X1 along the central axes Y1 and Y2. However, the first terminals 115t and the second terminals 125t are shaped in strips, and extend at angles with respect to the central axes Y1 and Y2 with lateral distance from the central axes Y1 and Y2. Accordingly, the distance between the first terminals 115t and the second terminals 125t decreases owing to the inclination of the terminals which is larger as the deviation increases, allowing the second terminals 125t to be superposed on the first terminals 115t, as indicated by the dotted lines. When W1/D1=W2/D2 is held, the first terminals 115t and the second terminals 125t can be interposed by putting the common point P2 on the common point P1.

Specifically, the above structure is such that the first terminals 115t of the first terminal group 115G are shaped in strips and extend along a plurality lines passing through the common point P1 apart therefrom in the direction intersecting the array axis X1; and the second terminals 125t of the third terminal group 125G are shaped in strips and extend along a plurality lines passing through the common point P2 apart therefrom in the direction intersecting the array axis X2. Thus, the relative distance between the terminals can be substantially changed by shifting the terminal groups (the array axes X1 and X2) along the central axes Y1 and Y2 (in the direction intersecting (in the example illustrated, perpendicular to) the array axes X1 and X2, respectively. Accordingly, even if a little difference is produced between the array pitches of the terminal groups, the terminals can be completely agreed with each other by positioning during mounting.

With the structure of the first terminal group 115G and the second terminal group 125G, even if the connecting board 120 changes in size by temperature changes or humidity absorption, the first terminals 115t and the second terminals 125t can be completely agreed with each other by adjusting the positions of the first terminals 115t and the second terminals 125t provided that the size change is even along the array axis X2, thereby preventing mount failure. Thus, the lateral size change of the connecting board 120 is made even by the structure of the embodiment. Consequently, the structure of the first terminal group 115G and the second terminal group 125G shown in FIG. 7 offers great advantages.

If only the evenness of the size change of the mount region is needed, the dummy wires 115D and 125D are not necessary. If there is no need to increase the evenness of the size change of the electrooptic panel 110 (if the size change of the substrate 111 of the electrooptic panel 110 can be ignored in comparison with the connecting board 120), the first dummy terminals 115Dt are not necessary.

Second Embodiment

Figure 8:
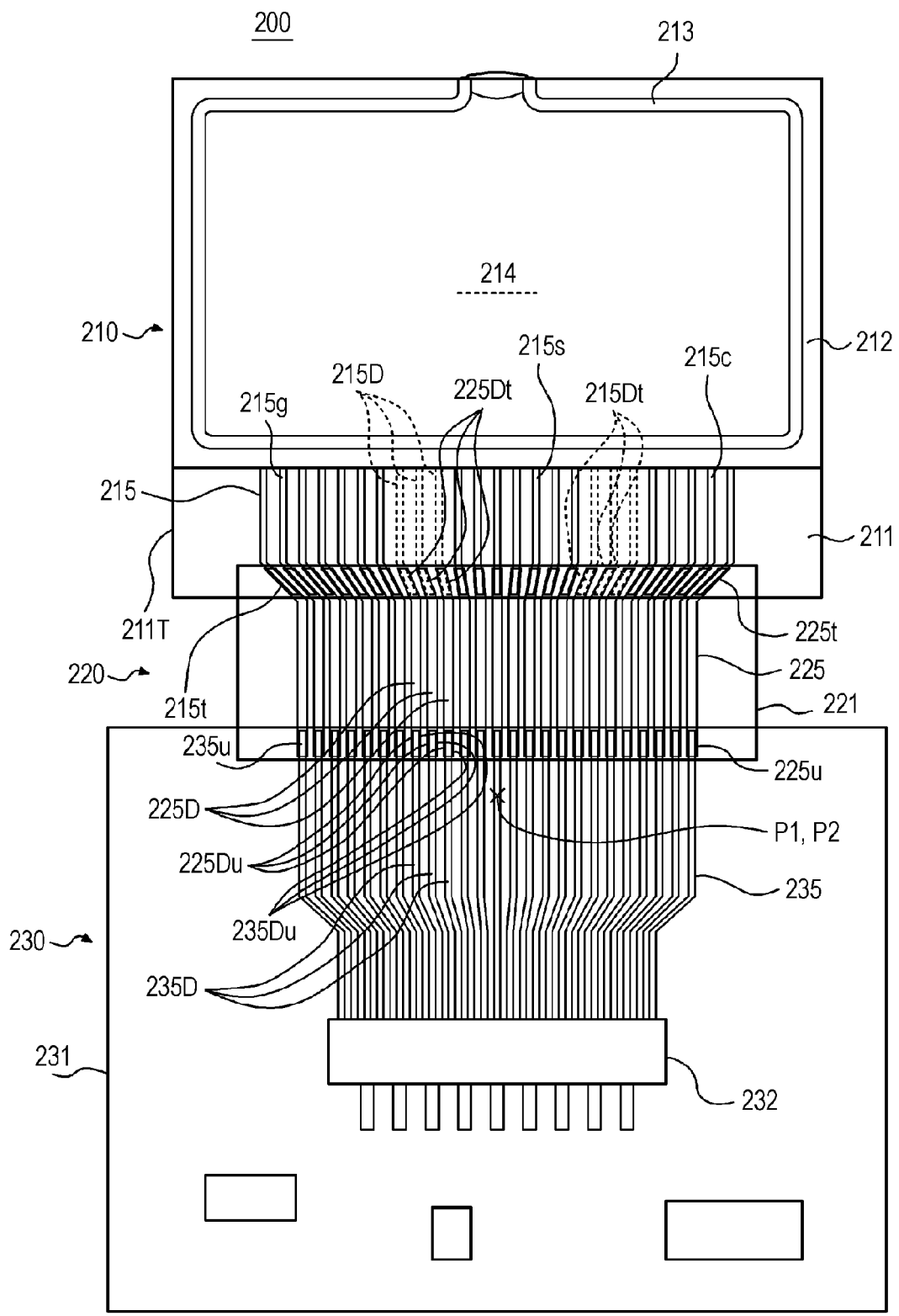
FIG. 8 is a schematic plan view of the entire structure of a second embodiment.

Referring to FIG. 8, an electrooptic device 200 according to a second embodiment of the invention will be described. The embodiment has an electrooptic panel 210 including substrates 211 and 212 with the same structure as in the first embodiment, a substrate extending portion 211T, a sealing member 213, liquid crystal 214, wires 215 (215g, 215s, and 215c), first terminals 215t, dummy wires 215D, and first dummy terminals 215Dt and a connecting board 220 mounted to the electrooptic panel 210 and including a substrate 221, wires 225, second terminals 225t, dummy wires 225D, and second dummy terminals 225Dt. Since the structure is the same as that of the first embodiment, a description thereof will be omitted.

In this embodiment, the connecting board 220 is a flexible wiring board, which is further mounted to a circuit board 230. Preferably, the circuit board 230 includes a substrate 231 made of hard resin such as glass epoxy resin or phenol resin, and a semiconductor chip serving as a driving circuit and other electronic components on the substrate 231 such as a wiring pattern and an integrated circuit chip (semiconductor chip) serving as a drive circuit.

In the mount region of the connecting board 220 and the circuit board 230, a plurality of third terminals 225u arrayed on the connecting board 220 and a plurality of fourth terminals 235u arrayed on the circuit board 230 are conductively connected in one to one correspondence. The mount region also has third dummy terminals 225Du at the ends of the dummy wires 225D of the connecting board 220 and fourth dummy terminals 235Du corresponding to the third dummy terminals 225Du as necessary. In the example illustrated, the fourth dummy terminals 235Du are formed at the ends of dummy wires 235D on the circuit board 230. To make the size change of only the mount region even, the dummy wires 225D and 235D are not necessary. If there is no need to increase the evenness of the size change of the circuit board 230 (if the size change of the circuit board 230 relative to the connecting board 220 can be ignored), the fourth dummy terminals 235Dt are not necessary.

In the mount region of the connecting board 220 and the circuit board 230, although the third terminals 225u and the fourth terminals 235u are arrayed in parallel, they may have the same shape and array as those of FIG. 7, as in the mount region of the electrooptic panel 210 and the connecting board 220.

Electronic Device

Figure 9:
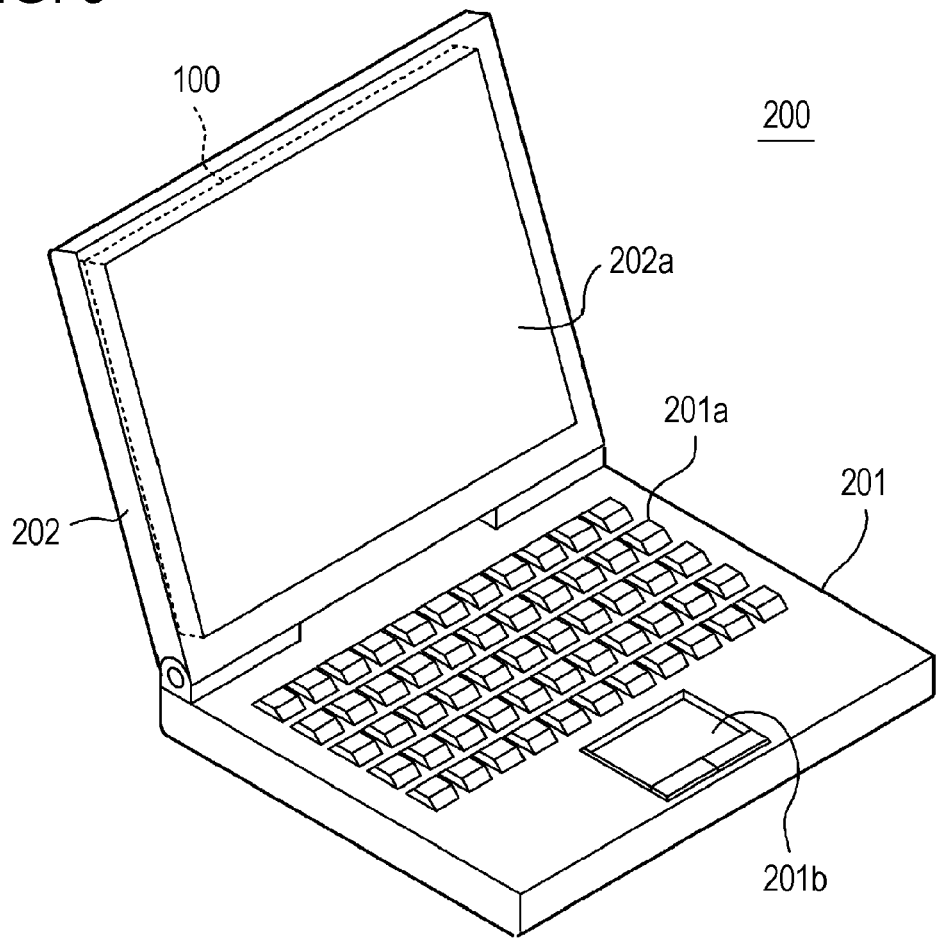
FIG. 9 is a schematic perspective view of an example of an electronic device.
Figure 10:
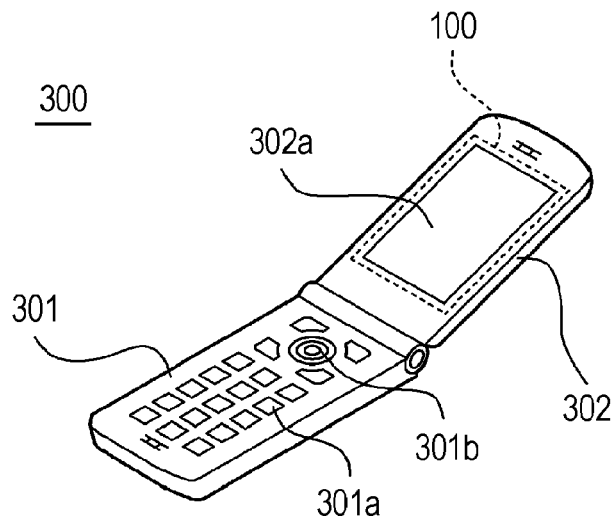
FIG. 10 is a schematic perspective view of another electronic device.

Referring last to FIGS. 9 and 10, an electronic device according to an embodiment of the invention will be described. FIG. 9 is a diagram of a notebook personal computer, denoted by 200, according to an embodiment of the invention. The personal computer 200 includes a main body 201 having a plurality of operation buttons 201a and another operating section 201b and a display section 202 connected to the main body 201 and having a display screen 202a. In this case, the main body 201 and the display section 202 are foldable. The display section 202 has the electrooptic device 100 built-in, which displays a desired image on the display screen 202a. In this case, the personal computer 200 houses a display control circuit for controlling the above-described electrooptic device 100. The display control circuit sends input data including a video signal and a specified control signal to the connecting board 120 to determine the operating state of the electrooptic panel 110.

FIG. 10 shows a mobile phone, denoted by numeral 300, which is an electronic device according to another embodiment of the invention. The mobile phone 300 includes an operating section 301 having a plurality of operation buttons 301a and 301b and a mouthpiece and a display section 302 having a display screen 302a and an earpiece, the display section 302 having the electrooptic device 100 built-in. The user can view a display image formed by the electrooptic panel 110 on the display screen 302a. In this case, the mobile phone 300 has the same display control circuit for controlling the electrooptic device 100 as the above.

It is needless to say that the mount structure and the electrooptic device of the invention are not limited to the examples illustrated and that various modifications may be made without departing from the spirit and scope of the invention. For example, although the electrooptic devices according to the embodiments include an electrooptic panel that configures a liquid crystal display, the invention may use not only the liquid crystal display but also various electrooptic panels such as organic electroluminescent displays, electrophoresis displays, and plasma display panels. The invention is not limited to the electrooptic device including the electrooptic panel but may also be applied to various mount structures including two or more electronic components such as a mount structure in which a connecting board and a circuit board are connected together.

What is claimed is:

1. An electro-optic device, comprising:
an electro-optic panel; and
a connecting board mounted to the electro-optic panel;
wherein
the electro-optic panel has a first terminal group including a plurality of first terminals;
the connecting board has a second terminal group including a plurality of second terminals conductively connected to the corresponding first terminals of the first terminal group;
the range in which the electro-optic panel and the connecting board are mounted includes
a terminal region in which the first terminals are arrayed substantially with an equal pitch, and
a no-terminal region in which there are no first terminals; and
the second terminal group has
in the terminal region, the second terminals arrayed in correspondence with the first terminals, respectively, and
at least a dummy terminal provided in the no-terminal region only in a position immediately adjacent to the second terminal at an edge of the terminal region,
wherein the first terminals are linear and a plurality of the first terminals converge toward a first common point, and
wherein the second terminals are linear and a plurality of the second terminals converge toward a second common point.

2. The electro-optic device according to claim 1, wherein the first terminal group has
a third terminal group including some of said first terminals provided as one kind of wires and arrayed in a first area of the terminal region, and
a fourth terminal group including some further said first terminals provided as another kind of wires and arrayed in a second area of the terminal region; and
the no-terminal region is positioned between the first and second areas of the terminal region.

3. The electro-optic device according to claim 1, wherein the at least one dummy terminal in the no-terminal region and the second terminals in the terminal region are arrayed substantially at said pitch.

4. The electro-optic device according to claim 1, wherein the first and second common points are spaced apart in a predetermined direction perpendicular to arrays of the first and second terminals.

5. The electro-optic device according to claim 4, wherein the at least one dummy terminal and the second terminals converge toward the second common point.

6. The electro-optic device according to claim 1, wherein the connecting board is a flexible wiring board.

7. An electronic device comprising the electro-optic device according to claim 1.

8. An electro-optic device, comprising:
an electro-optic panel; and
a connecting board mounted to the electro-optic panel;
wherein
the electro-optic panel has a first terminal group including a plurality of first terminals;
the connecting board has a second terminal group including a plurality of second terminals conductively connected to the corresponding first terminals of the first terminal group;
the range in which the electro-optic panel and the connecting board are mounted includes, in a width direction of the connecting board,
a terminal region in which the first terminals are arrayed in said width direction substantially with an equal pitch, and
a no-terminal region in which there are no first terminals across a range that is sufficiently wide in the width direction for accommodating at least three first terminals at said pitch, and which is located in said width direction between first and second areas of the terminal region; and
the second terminal group has
in the terminal region, the second terminals arrayed in said width direction in correspondence with the first terminals, respectively, and
two dummy terminals provided in the no-terminal region only in positions immediately adjacent in said width direction to the second terminals at facing edges of the first and second areas of the terminal region;
wherein the dummy terminals in the no-terminal region and the second terminals in the terminal region are arrayed in said width direction substantially at said pitch;
wherein the two dummy terminals in the no-terminal region are spaced in said width direction by an area free of any said first, second, and dummy terminals, a dimension of said area in said width direction being at least two times of said pitch;
wherein the first terminals are linear and a plurality of the first terminals converge toward a first common point; and
the second terminals are linear and a plurality of the second terminals converge toward a second common point.

9. The electro-optic device according to claim 8, wherein the first terminal group has
a third terminal group including some of said first terminals provided as one kind of wires and arrayed in the first area of the terminal region, and
a fourth terminal group including some further said first terminals provided as another kind of wires and arrayed in the second area of the terminal region.

10. The electro-optic device according to claim 9, wherein the electro-optic panel includes
a plurality of pixels,
at least a common electrode for multiple said pixels, and
for each said pixel, an active element and a pixel electrode connected to the active element;
the first terminals in the third terminal group are one selected from the group consisting of
selecting wires for selecting the active elements of the pixels of the electrooptic panel, respectively,
data wires for supplying specified potentials to the pixel electrodes of the pixels of the electro-optic panel, respectively, and
common wires for supplying a common potential to said multiple pixels;
and
the first terminals in the fourth terminal group are another one selected from the group consisting of said selecting wires, said data wires and said common wires.

11. The electro-optic device according to claim 8, wherein
all of the first terminals linearly extend respectively along first converging straight lines passing through the first common point;
all of the dummy terminals and all of the second terminals linearly extend respectively along second converging straight lines passing through the second common point; and
the first and second common points are spaced apart in a longitudinal direction perpendicular to said width direction.

12. The electro-optic device according to claim 8, wherein the connecting board is a flexible wiring board.

13. The electro-optic device according to claim 1, wherein
the no-terminal region extends over the range that is sufficient for accommodating at least three first terminals at said pitch.

14. The electro-optic device according to claim 11, wherein
the first common point is closer, in the longitudinal direction, to the connecting board than the second common point.

15. An electro-optic device, comprising:
an electro-optic panel; and
a connecting board mounted to the electro-optic panel;
wherein
the electro-optic panel has a first terminal group including a plurality of first terminals;
the connecting board has a second terminal group including a plurality of second terminals conductively connected to the corresponding first terminals of the first terminal group;
the range in which the electro-optic panel and the connecting board are mounted includes, in a width direction of the connecting board,
a terminal region in which the first terminals are arrayed in said width direction substantially with an equal pitch, and
a no-terminal region in which there are no first terminals across a range that is sufficiently wide in the width direction for accommodating at least three first terminals at said pitch, and which is located in said width direction between first and second areas of the terminal region; and
the second terminal group has
in the terminal region, the second terminals arrayed in said width direction in correspondence with the first terminals, respectively, and
two dummy terminals provided in the no-terminal region only in positions immediately adjacent in said width direction to the second terminals at facing edges of the first and second areas of the terminal region;
wherein the dummy terminals in the no-terminal region and the second terminals in the terminal region are arrayed in said width direction substantially at said pitch,
wherein the two dummy terminals in the no-terminal region are spaced in said width direction by an area free of any said first, second, and dummy terminals, a dimension of said area in said width direction being- at least two times of said pitch, wherein all of the first terminals linearly extend respectively along first converging straight lines passing through the first common point, wherein all of the dummy terminals and all of the second terminals linearly extend respectively along second converging straight lines passing through the second common point, wherein the first and second common points are spaced apart in a longitudinal direction perpendicular to said width direction, and wherein the first common point is closer, in the longitudinal direction, to the connecting board than the second common point.

* * * * *